(12) United States Patent
Choi (10) Patent No.: US 10,255,966 B2
(45) Date of Patent: Apr. 9, 2019

(54) MEMORY DEVICE AND OPERATING METHOD THEREOF

(71) Applicant: SK hynix Inc., Gyeonggi-do (KR)

(72) Inventor: Hae-Rang Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/641,844

(22) Filed: Jul. 5, 2017

(65) Prior Publication Data

US 2018/0108400 A1  Apr. 19, 2018

(30) Foreign Application Priority Data

Oct. 17, 2016 (KR) .................. 10-2016-0134238

(51) Int. Cl.
| | |
|---|---|
| *G11C 11/4093* | (2006.01) |
| *G11C 29/12* | (2006.01) |
| *G11C 11/4091* | (2006.01) |
| *G11C 11/406* | (2006.01) |
| *G11C 11/408* | (2006.01) |
| *G11C 11/4094* | (2006.01) |
| *G11C 29/18* | (2006.01) |
| *G11C 29/50* | (2006.01) |

(52) U.S. Cl.
CPC ...... *G11C 11/4093* (2013.01); *G11C 11/4085* (2013.01); *G11C 11/4091* (2013.01); *G11C 11/4094* (2013.01); *G11C 11/40611* (2013.01); *G11C 29/1201* (2013.01); *G11C 29/12005* (2013.01); *G11C 29/18* (2013.01); *G11C 29/50012* (2013.01); *G11C 29/50016* (2013.01); *G11C 2029/1202* (2013.01); *G11C 2029/1204* (2013.01); *G11C 2029/5004* (2013.01)

(58) Field of Classification Search
CPC .......... G11C 11/4093; G11C 11/40611; G11C 11/4091; G11C 29/1201; G11C 11/22
See application file for complete search history.

(56) References Cited

U.S. PATENT DOCUMENTS

| | | | | |
|---|---|---|---|---|
| 6,865,123 B2* | 3/2005 | Lee | ...................... | G11C 29/808 |
| | | | | 365/189.05 |
| 8,050,123 B2* | 11/2011 | Koshita | .................... | G11C 8/14 |
| | | | | 365/185.15 |
| 8,773,925 B2* | 7/2014 | Koya | ....................... | G11C 7/16 |
| | | | | 365/149 |
| 9,437,274 B1* | 9/2016 | Kim | ...................... | G11C 11/406 |
| 2015/0131356 A1* | 5/2015 | Kurokawa | .............. | H01L 22/20 |
| | | | | 365/51 |

FOREIGN PATENT DOCUMENTS

| | | |
|---|---|---|
| KR | 100287189 | 11/2000 |
| KR | 1020110002319 | 1/2011 |

* cited by examiner

*Primary Examiner* — Tri M Hoang
(74) *Attorney, Agent, or Firm* — IP & T Group LLP (57) ABSTRACT

A memory device includes a plurality of word lines; a plurality of bit lines; a plurality of memory cells, each memory cell coupled to a corresponding word line among the plurality of word lines and a corresponding bit line among the plurality of bit lines; and a control block suitable for controlling at least two word lines among the plurality of word lines to be activated together, and determining whether or not a weak cell exists, based on a voltage of a bit line corresponding to the activated word lines.

18 Claims, 8 Drawing Sheets

MEMORY DEVICE AND OPERATING METHOD THEREOF

CROSS-REFERENCE TO RELATED APPLICATION

This application claims priority under 35 U.S.C. § 119 to Korean Patent Application No. 10-2016-0134238 filed on Oct. 17, 2016 in the Korean Intellectual Property Office, the disclosure of which is incorporated herein by reference in its entirety.

TECHNICAL FIELD

Exemplary embodiments relate to a memory device and an operating method thereof.

DISCUSSION OF THE RELATED ART

In general, a memory cell of a semiconductor memory device such as a dynamic random access memory (DRAM) is constructed by a transistor serving as a switch and a capacitor storing charges that is, data. Data is identified as 'high' (logic 1) or 'low' (logic 0) depending on whether charges are present in the capacitor of the memory cell, that is, whether the voltage of the terminal of the capacitor is high or low.

In principle, storage of data does not consume power since the storage of data is implemented in such a manner that charges are accumulated in a capacitor. However, data may be lost due to an initial amount of charges stored in the capacitor vanishing due to leakage current attributable to the PN coupling of a metal-oxide-semiconductor (MOS) transistor, or the like. To prevent this, data in a memory cell should be read before the data is lost, and a normal amount of charges should be recharged based on read information. Storage of data may be retained only when such an operation is periodically repeated. Such a process for recharging cell charges is referred to as a refresh operation.

The refresh operation is performed each time a refresh command is transmitted from a memory controller to a memory. The memory controller transmits the refresh command to the memory with a predetermined time interval by considering the data retention time of the memory. For example, if the data retention time of a memory is 64 ms and the entire memory cells in the memory may be refreshed when a refresh command is received 8000 times, the memory controller transmits the refresh command to the memory 8000 times for 64 ms.

In a test process of a memory device, if the data retention times of some of the memory cells included in the memory device do not exceed a predetermined reference time, the corresponding memory device is handled as a fail. The memory device handled as a fail in this way should be discarded.

If all of memory devices including memory cells having data retention times not exceeding a reference time that is, weak cells, are handled as fails, then the yield of the memory devices cannot help but decrease. Furthermore, although a memory device has passed a test, an error may occur if a weak cell is induced due to a posterior factor.

Moreover, as ultra-high degree of integration results due to the fact that at least several tens of millions of cells are integrated in one chip, it may be mentioned that the probability of a weak cell to exist increases even through manufacturing processes are developed. If a test is not precisely carried out for such a weak cell, it may be difficult to secure reliability of a semiconductor memory device. Therefore, various schemes and methods for detecting a weak cell are being researched.

SUMMARY

Various embodiments are directed to a memory device which shortens a test time needed to detect a weak cell, and an operating method thereof.

In an embodiment, a memory device may include: a plurality of word lines; a plurality of bit lines; a plurality of memory cells, each memory cell coupled to a corresponding word line among the plurality of word lines and a corresponding bit line among the plurality of bit lines; and a control block suitable for controlling at least two word lines among the plurality of word lines to be activated together, and determining whether or not a weak cell exists, based on a voltage of a bit line corresponding to the activated word lines.

In an embodiment, a method for operating a memory device including a plurality of word lines, a plurality of bit lines and a plurality of memory cells), each memory cell coupled to a corresponding word line among the plurality of word lines and a corresponding bit line among the plurality of bit lines may include: activating at least two word lines together among the plurality of word lines; sharing charges between memory cells coupled to the same bit line among memory cells coupled to the activated word lines and the bit line; and determining that a weak cell exists among the memory cells coupled to the activated word lines, based on a voltage of the bit line corresponding to the activated word lines being lower than a reference voltage, and determining that the weak cell does not exist among the memory cells coupled to the activated word lines, when the voltage of the bit line corresponding to the activated word lines is equal to or higher than the reference voltage.

In an embodiment, a memory device may include: first to $n^{th}$ (where n is a natural number) word line groups each including at least two word lines; and a control block suitable for controlling the first to $n^{th}$ word line groups to be activated sequentially, and determining whether or not a weak cell exists among memory cells coupled to an activated word line group, based on a voltage of a bit line corresponding to the activated word line group.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 1:
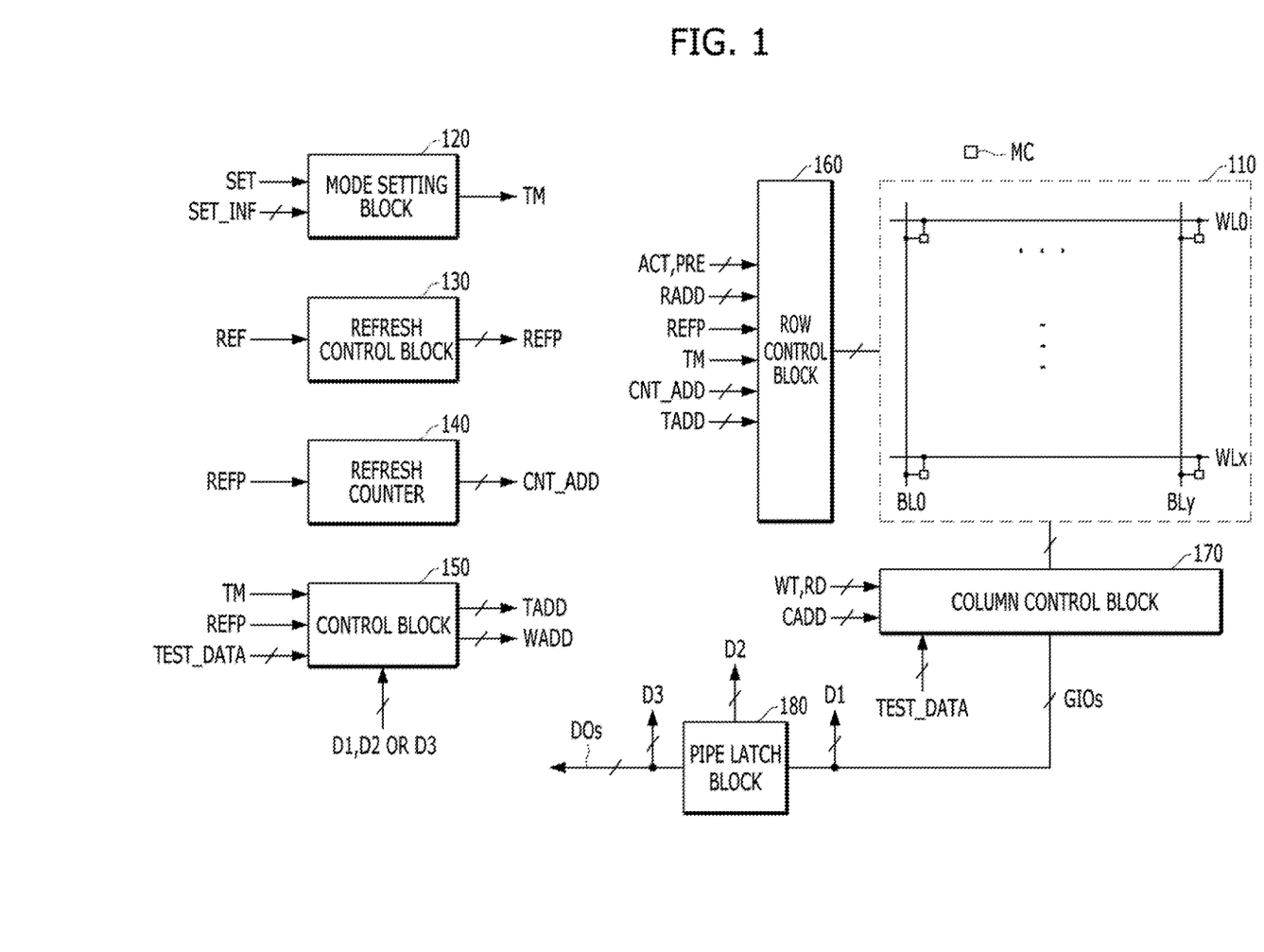
FIG. 1 is a diagram illustrating a memory device in accordance with an embodiment.

FIG. 1 is a diagram illustrating a memory device in accordance with an embodiment.

Referring to FIG. 1, the memory device may include a cell array 110 a mode setting block 120, a refresh control block 130, a refresh counter 140, a control block 150, a row control block 160, a column control block 170, and a pipe latch block 180.

The cell array 110 may include a plurality of word lines WL0 to WLx (where x is a natural number), a plurality of bit lines BL0 to BLy (where y is a natural number), and a plurality of memory cells MC. The detailed configuration and operation of the cell array 110 will be described later with reference to FIG. 2.

The mode setting block 120 may set the memory device to one operation mode of a normal operation mode and a test operation mode. The mode setting block 120 may deactivate a test mode signal TM when the memory device is set to the normal operation mode, and activate the test mode signal TM when the memory device is set to the test operation mode. The mode setting block 120 may deactivate or activate the test mode signal TM in response to a setting information SET_INF, when a set command SET is applied. The setting information SET_INF may include at least one signal of command signals and address signals.

The refresh control block 130 may activate a refresh signal REFP at least one time in response to a refresh command REF. A count by which the refresh signal REFP is activated may be set to correspond to a count by which a refresh operation is performed in response to the refresh command REF at one time.

The refresh counter 140 may perform counting in response to the refresh signal REFP, and generate a counting address CNT_ADD. The refresh counter 140 may increase the value of the counting address CN_ADD by 1 through counting. Increasing the value of the counting address CN_ADD by 1 may mean that the counting address CNT_ADD is changed such that, if a $k^{th}$ word line is selected this time, a (k+1) word line is selected next time.

The control block 150 may control at least two word lines among the plurality of word lines WL0 to WLx to be activated together in the test operation mode, and determine whether or not a weak cell exists, by using the voltage of each of bit lines corresponding to activated word lines. The control block 150 may test whether a weak cell is included in the memory cells coupled to at least two word lines, through a one-time test operation.

The control block 150 may determine that no weak cell exists among the memory cells MC coupled to activated word lines, when the voltage of a bit line is equal to or higher than a reference voltage. Also, the control block 150 may determine that a weak cell exists among the memory cells MC coupled to activated word lines, when the voltage of a bit line is lower than the reference voltage.

First, the same data for example, logic 0 level data or logic 1 level data, hereinafter, referred to as test data TEST_DATA may be written in the plurality of memory cells MC which are coupled to at least two word lines as test targets. Thereafter, the control block 150 may generate a test address TADD when the test mode signal TM is activated. The control block 150 may update for example, increase the test address TADD when the refresh signal REFP is activated. In a test operation, if the refresh signal REFP is activated, at least two word lines corresponding to the test address TADD may be activated together for a predetermined time.

For reference, the test address TADD may be an address for selecting at least two word lines together among the plurality of word lines WL0 to WLx. When an address for selecting one word line includes 10 bits, the test address TADD may be an address which includes only a predetermined number of upper bits among the 10 bits. For example, when an address for selecting one word line includes 10 bits, the test address TADD may be an address which includes only upper 6 bits among the 10 bits. When using the test address TADD, 16 word lines of which the values of upper 6-bit addresses are the same and the values of lower 4-bit addresses are different may be selected together.

The control block 150 may compare the data of bit lines and the test data TEST_DATA after the predetermined time passes. The control block 150 may determine that a weak cell is included among the memory cells coupled to at least two word lines as test targets, when the data of the bit lines and the test data TEST_DATA are different. Also, the control block 150 may determine that no weak cell is included among the memory cells coupled to at least two word lines as test targets when the data of the bit lines and the test data TEST_DATA are the same.

The control block 150 may store, the test address TADD as a weak address WADD, when it is determined as a result of a test operation that a weak cell is included among the memory cells coupled to word lines corresponding to the test address TADD.

In a read operation, the data outputted from the cell array 110 may be transferred to a plurality of global lines GIOs by control of the column control block 170. The data of the plurality of global lines GIOs may be latched in the pipe latch block 180, and then be outputted to an exterior of the memory device. In a test operation, the data of bit lines may pass through the global lines GIOs and the pipe latch block 180 by control of the column control block 170. The control block 150 may determine whether a weak cell is included, by comparing data D1 of the plurality of global lines GIOs, data D2 latched in the pipe latch block 180 or data D3 outputted from the pipe latch block 180 with the test data TEST_DATA stored in itself. The data outputted from the pipe latch block 180 may be transferred through data output lines DQs.

The row control block 160 may control the active and precharge operations for a word line selected by a row address RADD, the counting address CNT_ADD or the test address TADD. The row control block 160 may activate a word line corresponding to the row address RADD when an active command ACT is applied, and precharge the activated word line when a precharge command PRE is applied. If the refresh signal REFP is activated with the test mode signal TM deactivated, the row control block 160 may activate a word line corresponding to the counting address CNT_ADD for the predetermined time and then precharge the word line. If the refresh signal REFP is activated with the test mode signal TM activated, the row control block 160 may activate at least two word lines corresponding to the test address TADD together for the predetermined time and then precharge the word lines.

The column control block 170 may read the data of a bit line selected by a column address CADD when a read command RD is applied. Also, the column control block 170 may write data through a bit line selected by the column address CADD when a write command WT is applied. Data to be inputted to or be outputted from the cell array 110 may be transferred through the global lines GIOs. When the test mode signal TM is activated, if the predetermined time passes after at least two word lines are activated, the column control block 170 may transfer the data of bit lines to the global lines GIOs.

Figure 2:
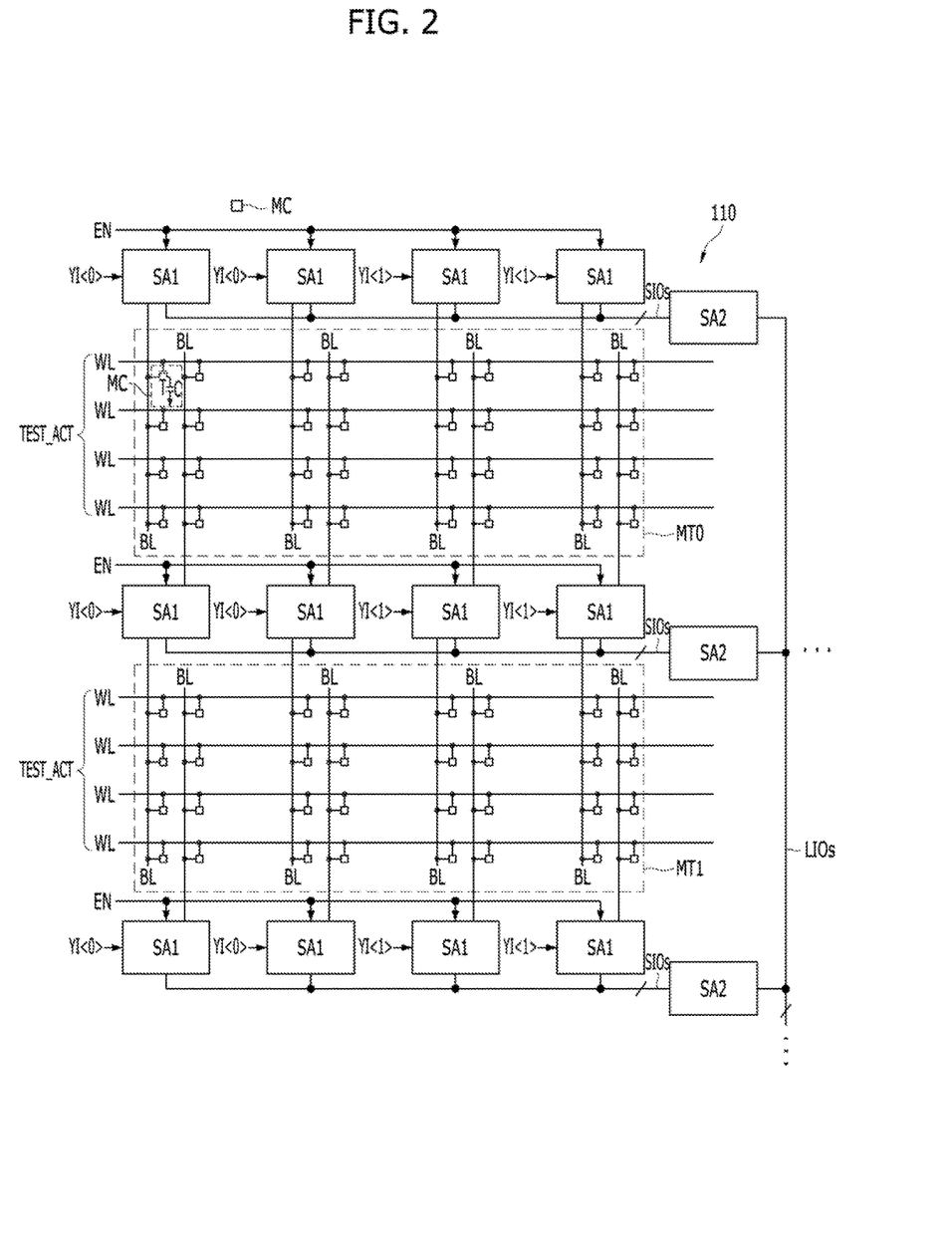
FIG. 2 is a diagram illustrating an example of a part of the internal configuration of the cell array shown in FIG. 1.

FIG. 2 is a diagram illustrating an example of a part of the internal configuration of the cell array 110 shown in FIG. 1.

Referring to FIG. 2, the cell array 110 may include cell mats MT0 and MT1, first sense amplifiers SA1, a plurality of word lines WL, a plurality of bit lines BL, a plurality of memory cells MC, SIO lines SIOs, second sense amplifiers SA2, and local lines LIOs. Each of the memory cells MC may include a cell transistor T and a cell capacitor C. In FIG. 2 the internal configuration of only one memory cell MC is illustrated. While only 2 cell mats MT0 and MT1 among the cell mats included in the cell array 110 are illustrated in FIG. 2, the cell array 110 may include at least several tens to several hundreds of cell mats. The numbers of word lines WL and bit lines BL corresponding to each eel mat and the number of the memory cells MC included in each cell mat may be changed depending on a design.

The first sense amplifiers SA1 may be activated in response to an enable signal EN, and sense and amplify the data of the bit lines BL in the activated state. Each of the first sense amplifiers SA1 may transfer data between corresponding bit lines BL and the SIO lines SIOs when corresponding column select signals of column select signals YI<0:1> are activated.

When an operation is performed in the test operation mode, the enable signal EN may retain a deactivated state, and only the column select signals YI<0:1> may be activated. The first sense amplifiers SA1 may not amplify the data of the corresponding bit lines BL, and may electrically couple the corresponding bit lines BL and the SIO lines SIOs.

The second sense amplifiers SA2 may sense and amplify the data of the SIO lines SIOs, and transfer them to the LIO lines LIOs. The second sense amplifiers SA2 may transfer first data for example, logic 1 level data to the local lines LIOs when the voltages of the SIO lines SIOs are higher than a predetermined level, and transfer second data for example, logic 0 level data to the local lines LIOs when the voltages of the SIO lines SIOs are lower than the predetermined level.

In a test operation, if the predetermined time passes after the same data is written in the memory cells MC, at least two word lines WL may be activated together (see TEST_ACT). If at least two word lines WL are activated together, memory cells MC corresponding to the respective word lines WL may be electrically coupled with bit lines BL.

Figure 3A:
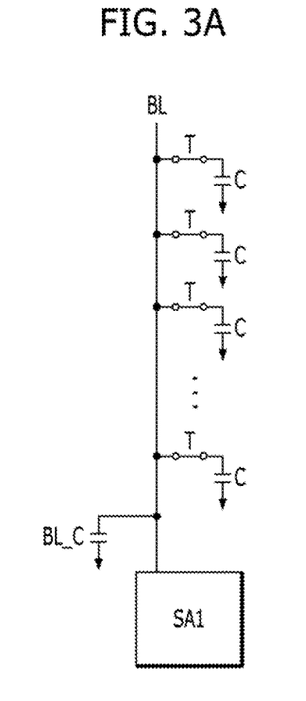
FIG. 3A is a diagram illustrating an example of a state in which a plurality of memory cells are electrically coupled simultaneously to one bit line.

FIG. 3A is a diagram illustrating an example in which a plurality of memory cells MC are electrically coupled simultaneously to one bit line BL. In FIG. 3A, each cell transistor T is illustrated in the form of a turned-cm switch. As shown in FIG. 3A, in a test operation, at least two cell capacitors C may be electrically coupled simultaneously to one bit line BL. When designating the capacitance existing in the bit line BL by the reference symbol BL_C, the voltage of the bit line BL may be changed as time passes, due to charge sharing between the cell capacitors C and the bit line BL having the capacitance BL_C. In FIG. 3A, an illustration of word lines is omitted.

Figure 3B:
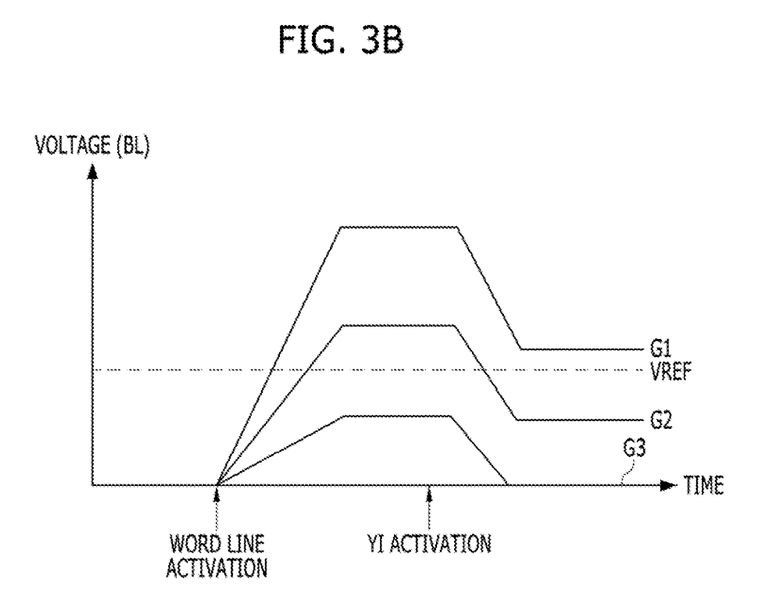
FIG. 3B is a diagram illustrating the voltage variation of a bit line over time, depending on the data retention times of the memory cells of FIG. 3A.

FIG. 3B is a diagram illustrating the voltage variation of the bit line BL over time, depending on the data retention times of the memory cells MC of FIG. 3A.

Referring to FIG. 3B, a first graph. G1 may represent the voltage variation of the bit line BL when the average data retention time of the memory cells MC is longer than that of a general memory cell MC hereinafter, referred to as CASE1. In CASE1 some or all of the memory cells MC may have a longer data retention time than the general memory cell MC. A second graph G2 may represent the voltage variation of the bit line BL when the average data retention time of the memory cells MC is similar to that of the general memory cell MC hereinafter, referred to as CASE2. A third graph G3 may represent the voltage variation of the bit line BL when the average data retention time of the memory cells MC is shorter than that of the general memory cell MC hereinafter, referred to as CASE3. In CASE3, some or all of the memory cells MC may be weak cells.

When observing the first to third graphs G1 to G3, it may be seen that the voltage variation of the bit line BL per a time and the maximum value of the voltage of the bit line BL are changed depending on the average data retention time of the memory cells MC. The reason to this is as follows. While the amount of the charges stored in an ideal memory cell MC is retained regardless of time, the amount of the charges stored in a cell capacitor C actually decreases gradually as time passes. In this regard, the amount of the charges stored in a cell capacitor C decreases slowly as a data retention time is long, and decreases quickly in the case of a weak cell. Therefore, when the memory cells MC are coupled with the bit line BL, the sum of the amounts of the charges stored in the cell capacitors C of the memory cells MC is largest in CASE1 and is smallest in CASE3.

Since the movement of charges is fast as a charge amount difference between the memory cells MC and the bit line BL is large, the voltage variation of the bit line BL per a time is largest in the first: graph. Further, since the amount of the charges shared by the bit line BL when charges are completely distributed is large, due to the amounts of the charges stored in the memory cells MC being large, the maximum value of the voltage of the bit line BL is highest in the first graph G1. Due to the fact that CASE1 and CASE2 have voltage levels higher than a reference voltage VREF and CASE3 has a voltage level, lower than the reference voltage VREF at a time when the column select signals YI<0:1> are activated, the logic 1 level data may be outputted from the second sense amplifiers SA2 in CASE1 and CASE2, and the logic 0 level data may be outputted from the second sense amplifiers SA2 in CASE3. Since the data written originally in the memory cells MC is the logic 1 level data, by comparing the data outputted from the cell array 110 and the logic 1 level data as the test data TEST_DATA, it is possible to determine whether a weak cell is included among the memory cells MC coupled with at least two word lines WL as test targets.

Figure 4:
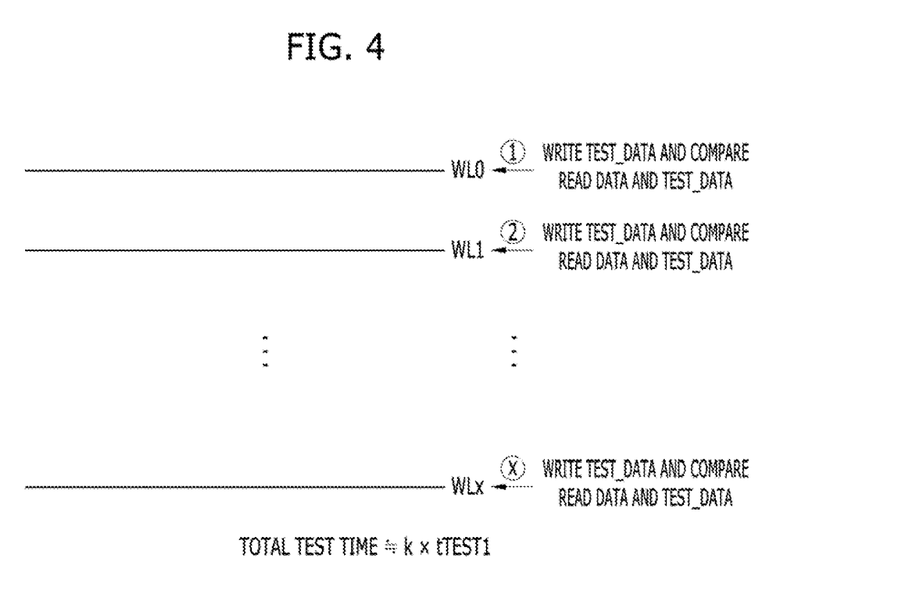
FIG. 4 is a diagram illustrating a conventional test operation.

FIG. 4 is a diagram illustrating a conventional test operation.

Referring to FIG. 4, the conventional test operation may be performed individually for one word line. The test operation may be performed in the following sequence. First, test data TEST_DATA may be written in a word line as a test target. Thereafter, after a predetermined time passes when the word line as a test target s not refreshed for the predetermined time, the memory cells (not shown in FIG. 4) coupled with the word line as a test target may be read and read data may be compared with the test data TEST_DATA. The predetermined time may be a reference time for determining a weak cell. For example, when the refresh cycle defined in the specification is tRFC, the reference time may be set to tRFC, n (where n is a natural number) times tRFC or 1/n times tRFC.

Thus, when a time needed to test one word line in the conventional art is tTEST1, a time equal to or longer than k×tTEST1 may be needed to test all of k number of word lines.

Figure 5:
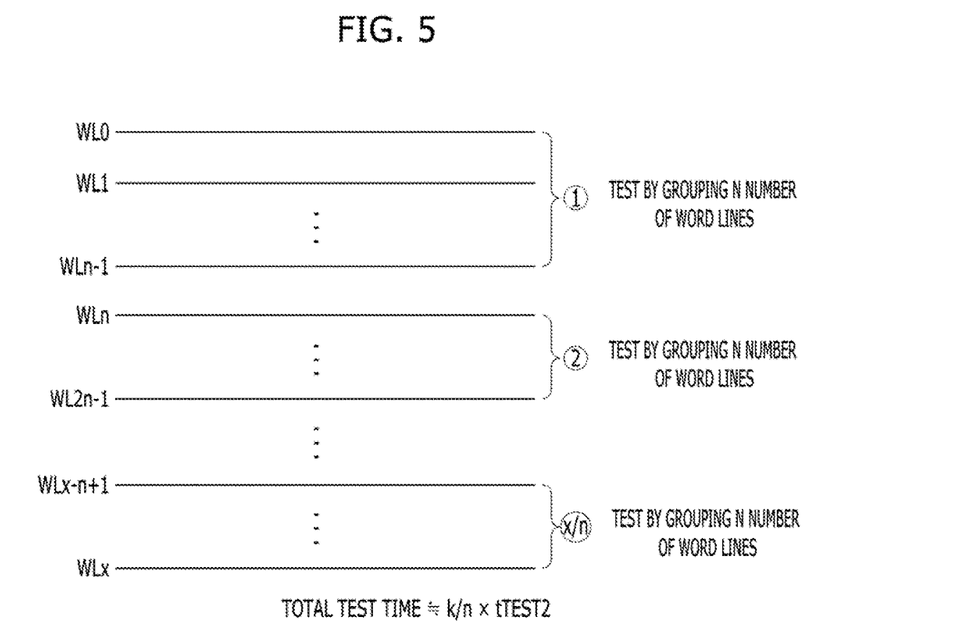
FIG. 5 is a diagram illustrating the test operation of the memory device shown in FIG. 1.

FIG. 5 is a diagram illustrating the test operation of the memory device shown in FIG. 1.

Referring to FIG. 5, the test operation of the memory device shown in FIG. 1 may be performed by grouping n number of word lines at a time. The test operation may be performed in the following sequence. First, test data TEST_DATA may be written in word lines as test targets. Thereafter, after a predetermined time passes when the word lines as test targets are not refreshed for the predetermined time, data corresponding to the voltage of a bit line BL that is determined by activating n number of word lines together may be compared with the test data TEST_DATA.

Thus, when a time needed to test n number of word lines for the memory device, shown in FIG. 1 is tTEST2 advantages may be provided in that it is possible to test all of k number of word lines within a time k/n×tTEST2. Since n may be set variously, a test time may be significantly shortened by increasing n. Otherwise, the position of a weak cell may be specified in detail by decreasing n.

Figure 6:
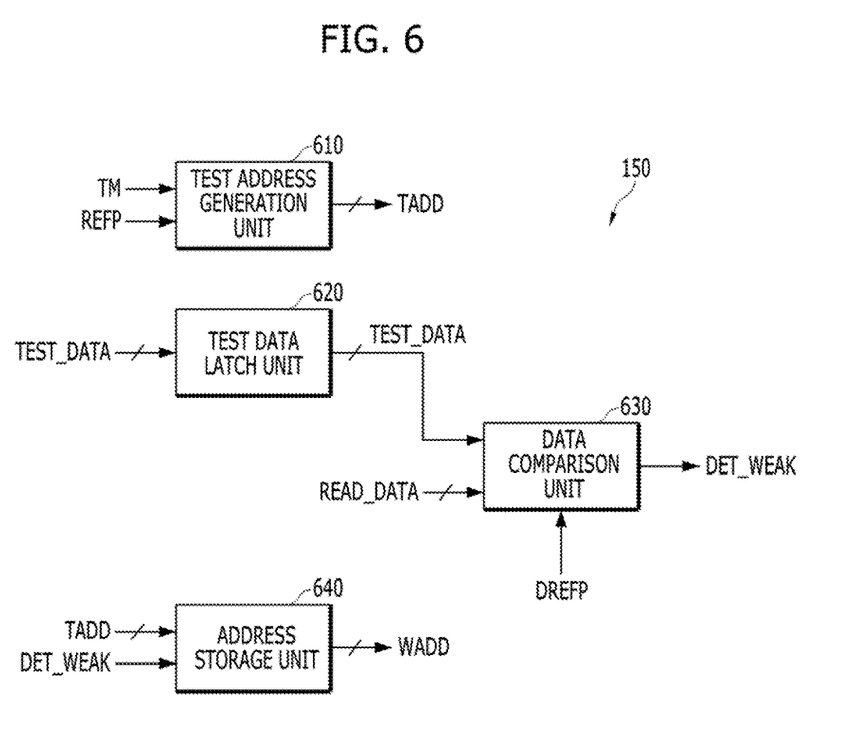
FIG. 6 is a diagram illustrating an example of the control block shown in FIG. 1.

FIG. 6 is a diagram illustrating an example of the control block 150 shown in FIG. 1.

Referring to FIG. 6, the control block 150 may include a test address generation unit 610, a test data latch unit 620, a data comparison unit 630, and an address storage unit 640.

The test address generation unit 610 may generate the test address TADD when the test mode signal TM is activated, and increase the test address TADD when the refresh signal REFP is activated.

The test data latch unit 620 may latch the test data TEST_DATA which is written in memory cells as test targets, when the test mode signal TM is activated, and output the test data TEST_DATA.

The data comparison unit 630 may compare the test data TEST_DATA and read data READ_DATA outputted from the cell array 110, and determine whether a weak cell is included among the memory cells coupled to at least two word lines as test targets. The data comparison unit 630 may perform the comparison operation in response to a delayed refresh signal DREFP which is generated by delaying the refresh signal REFP. The read data READ_DATA may be one data among the data D1, D2 and D3 of FIG. 2. The data comparison unit 630 may activate or deactivate a weak cell detection signal DET_WEAK according to a comparison result.

The address storage unit 640 may store the test address TADD as the weak address WADD when the weak cell detection signal DET_WEAK is activated. The address storage unit 640 in accordance with the embodiment may directly store the test address TADD as the weak address WADD when the weak cell detection signal DET_WEAK is activated. The address storage unit 640 may output the weak address WADD for a refresh operation for a weak cell.

Figure 7:
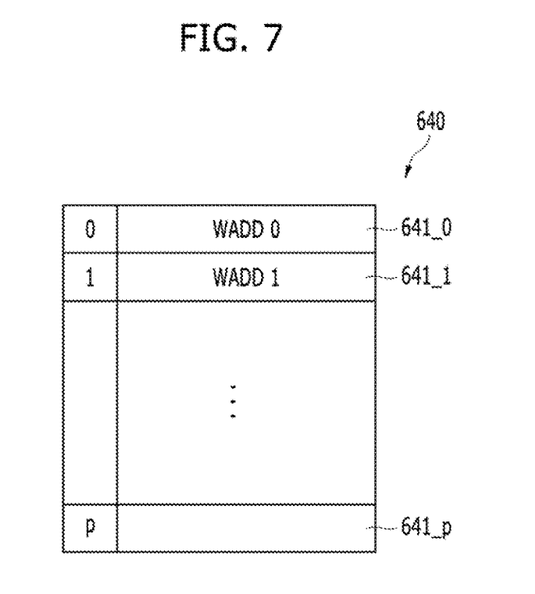
FIG. 7 is a diagram illustrating an example of storage of a weak address in the address storage unit shown in FIG. 6.

FIG. 7 is a diagram illustrating an example of storage of a weak address in the address storage unit 640 in accordance with the embodiment.

Referring to FIG. 7, the address storage unit 640 may store the test address TADD sequentially as weak addresses WADD0, WADD1, . . . , every time the weak cell detection signal DET_WEAK is activated. The address storage unit 640 may include a plurality of address storage sections 641_0 to 641_p (where p is a natural number), and store weak addresses sequentially in the plurality of address storage sections 641_0 to 641_p every time the weak cell detection signal DET_WEAK is activated.

Figure 8:
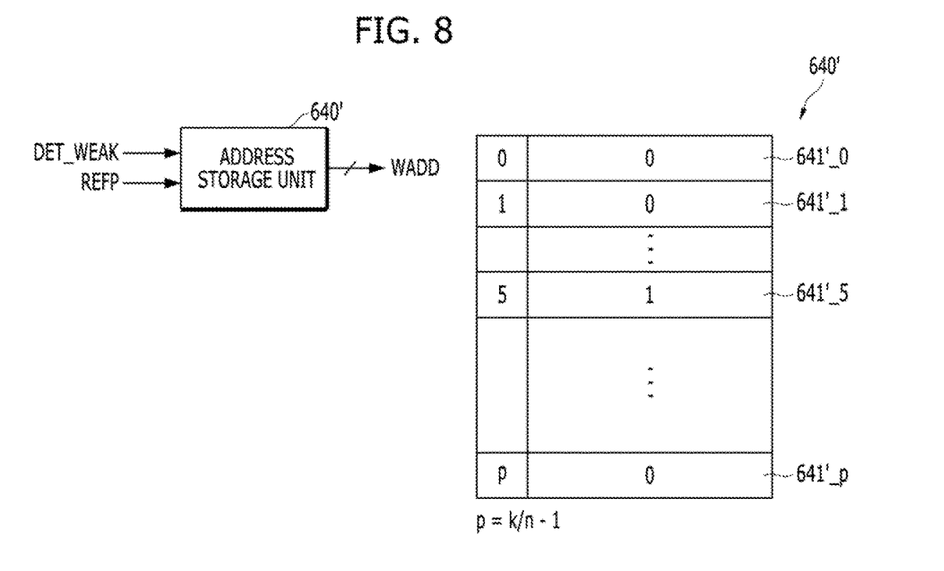
FIG. 8 is a diagram illustrating an address storage unit according to a variation of an embodiment and an example of storage of a weak address in the address storage unit.

FIG. 8 is a diagram illustrating an address storage unit 640' according to a variation of the embodiment and an example of storage of a weak address in the address storage unit 640'.

Referring to FIG. 8, the address storage unit 640' may include a plurality of registers 641'_0 to 641'_p, and change a selected register in response to the refresh signal REFP. The address storage unit 640' may store the activation of the weak cell detection signal DET_WEAK in a currently selected register, when the weak cell detection signal DET_WEAK is activated. For example, when the value stored in a zeroth register is '0,' it may indicate that a weak cell is not included among the memory cells coupled to word lines corresponding to the test address TADD '0.' When the value stored in a fifth register is '1,' it may indicate that a weak cell is included among the memory cells coupled to word lines corresponding to the test address TADD '5.' That is, it may indicate that the test address TADD '5' is a weak address.

Figure 9:
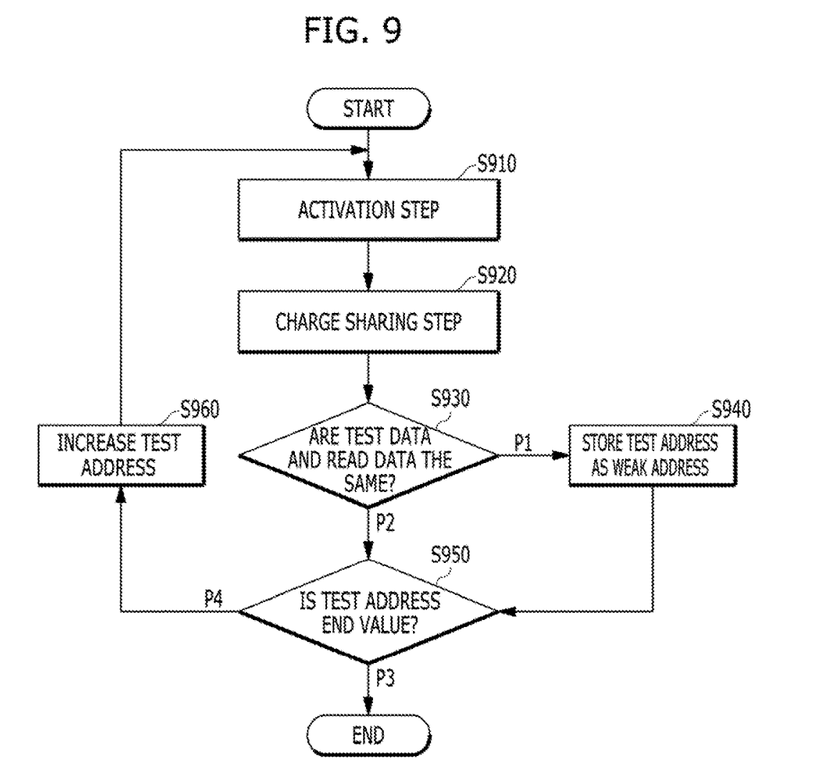
FIG. 9 is a flow chart illustrating a method for operating a memory device in accordance with an embodiment.

FIG. 9 is a flow chart illustrating a method for operating a memory device in accordance with an embodiment.

Referring to FIG. 9, the method for operating a memory device may include word line activation step S910, charge sharing step S920, determination step S930, and storage step S940.

In the word line activation step S910, at least two word lines corresponding to a current test address TADD may be activated together. If at least two word lines are activated, the memory cells MC coupled to the activated word lines may be electrically coupled with a corresponding bit line BL.

If the memory cells MC are electrically coupled with the corresponding bit line BL, in the charge sharing step S920, charges may be shared between the memory cells MC and the bit line BL. Depending on the amount of the charges stored in the memory cells MC, the voltage variation of the bit line BL per a time and the maximum value of the voltage of the bit line BL may be changed.

In the determination step S930, the control block 150 of FIG. 1 may compare the test data TEST_DATA and the read data READ_DATA outputted from the cell array 110, and determine whether a weak cell exists among the memory cells MC coupled to the word lines as test targets. When a weak cell exists that is, the test data TEST_DATA is different from the read data READ_DATA, the process may proceed through a path P1 to the storage step S940. At the storage step S940 the test address TADD may be stored as the weak address WADD. When a weak cell does not exist that is, the test data TEST_DATA is the same as the read data READ_DATA, the process may proceed through a path P2 to step S950. At the step S950, it is determined whether the value of the test address TADD is an end value. When the value of the test address TADD is the end value, the process may proceed through a path P3 from the step S950, and a test is completed. When the value of the test address TADD is not the end value, the process may process through a path P4 to step S960. At the step S960, the test address TADD may be increased such that a test may be performed again from the start.

While the method for operating a memory device, shown in FIG. 9 may determine whether a weak cell exists in a group including n number of word lines as the unit of test hereinafter, referred to as a word line group, it is not possible to know which word line is coupled to the weak cell in the word line group. To detect an individual word line to which a weak cell is coupled, the test described above with reference to FIG. 4 should be performed. However, in the case of utilizing the method for operating a memory device, of FIG. 9, a test time for detecting an individual word line to which a weak cell is coupled may be shortened.

Figure 10:
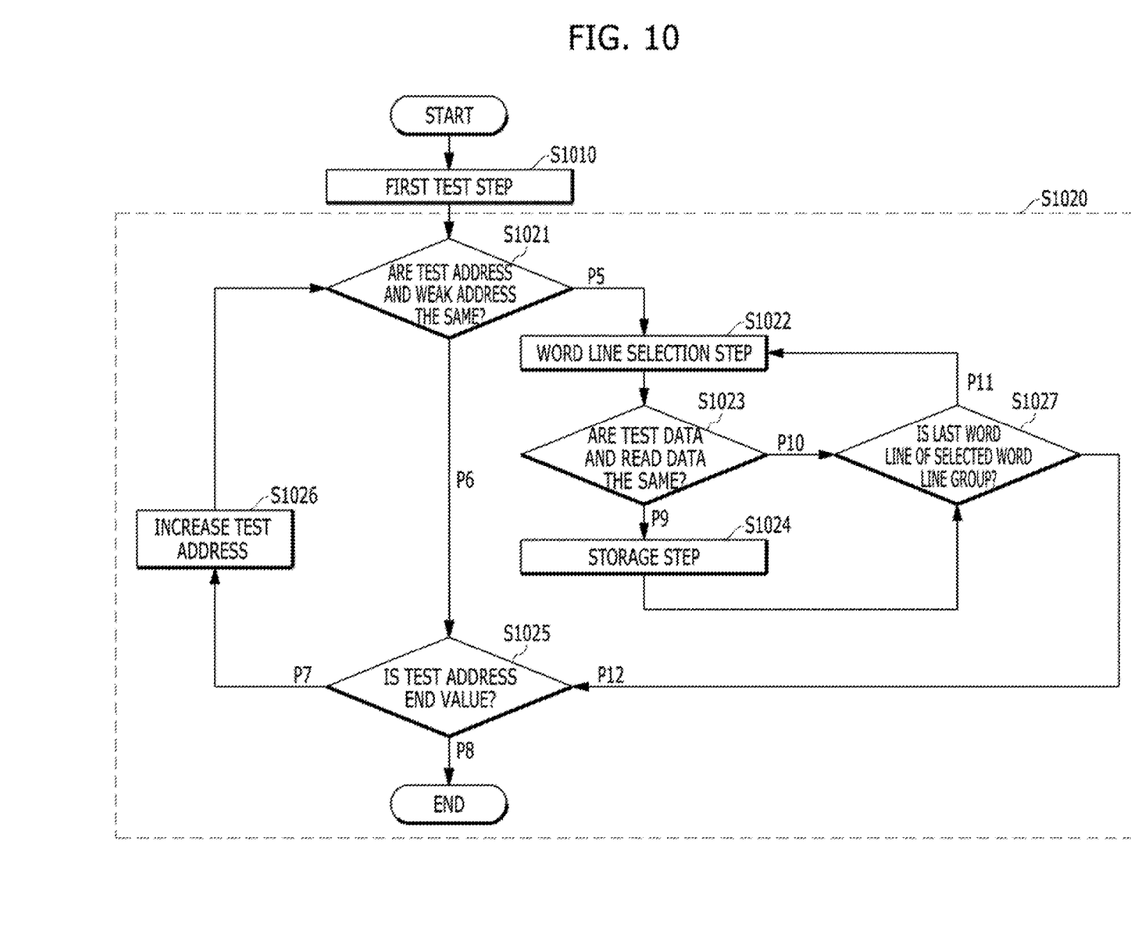
FIG. 10 is a flow chart illustrating a method for operating a memory device in accordance with an embodiment.

FIG. 10 is a flow chart illustrating a method for operating a memory device in accordance with an embodiment.

Referring to FIG. 10, the method for operating a memory device may include first test step S1010 and second test step S1020 The first test step S1010 may be the same as the method for operating a memory device, of FIG. 9.

If the first test step S1010 is completed, a word line group which includes a weak cell may be detected. In the second test step S1020, an individual test may be performed for only the word lines included in the word line group which includes a weak cell, and an individual word line to which a weak cell is coupled may be detected.

The second test step S1020 may include word line group selection step S1021, word line selection step S1022, test step S1023, and storage step S1024.

In the word line group selection step S1021, the test address TADD and the weak address WADD detected in the first test step S1010 may be compared to determine whether they are the same. If the test address TADD and the weak address WADD are the same, the process may proceed through a path P5 to perform a test by selecting a word line group corresponding to the corresponding test address TADD. When the test address TADD and the weak address WADD are not the same, the process may proceed through a path P6 to step S1025. At the step S1025, it is determined whether the value of the test address TADD is an end value. When the value of the test address TADD is not the end value the process may process through a path P7 to step S1026. At the step S1026 the test address TADD may be increased, and then the process may proceed to the word line group selection step S1021. When the value of the test address TADD is the end value, the process may proceed through a path P8, and the second test step S1020 may be ended.

If the word line group is selected, at the word line selection step S1022, the individual word lines included in the selected word line group may be selected sequentially. If an individual word line is selected, at the individual word line test step S1023, test data TEST_DATA is written in the memory cells coupled to the selected word line, and, after a predetermined time passes, the data of the memory cells coupled to the selected word line may be read and the test data TEST_DATA and the read data READ_DATA may be compared.

When the test data TEST_DATA and the read data READ_ DATA are different, the process may proceed to the storage step S1024 through a path P9, and the address of the selected word line may be stored. When the test data TEST_DATA and the read data READ_DATA are the same, the process may proceed to a step S1027 through a path P10. At the step S1027, it is determined whether the selected word line is a last word line of the selected word line group. When the selected word line is not the last word line of the selected word line group, the process may proceed through a path P11 to the step S1022, and the selected word line may be changed. When the selected word line is the last word line of the selected word line group, the process may proceed from the step S1027 through a path P12 to the step S1025.

Figure 11:
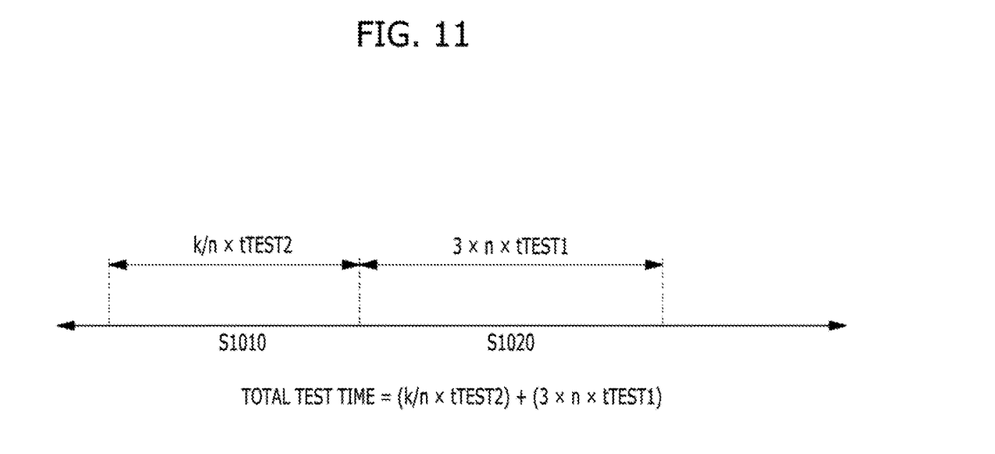
FIG. 11 is a diagram illustrating the test time by the method for operating a memory device shown in FIG. 10.

FIG. 11 is a diagram illustrating the test time using the method for operating a memory device shown in FIG. 10.

Referring to FIG. 11, the method for operating a memory device performs first the first test step S1010, and a time (k/n×tTEST2) is needed to complete the first test step S1010. Thereafter, the individual word line test may be performed through the second test step S1020 for only the word lines included in a word line group which includes a weak cell. For example, when the number of word line groups each including a weak cell is 3, the individual word line test is performed for only the 3 word line groups. When a time needed to test an individual word line is tTEST1 as shown in FIG. 4, the time needed to test all individual word lines is (3×n×tTEST1).

Therefore, in the method for operating a memory device, of FIG. 10, a time needed to detect all individual word lines each including a weak cell is (k/n×tTEST2)+(3×n×tTEST1), and may be shortened when compared to the time (k×tTEST1) needed to perform the test operation of FIG. 4. For example, when k=8192, n=16 and tTEST1≈tTEST2=tTEST, while a time of 8192×tTEST is needed to complete a test for the test method of FIG. 4, a test may be completed by using a time of 560×tTEST for the method for operating a memory device, of FIG. 10.

As is apparent from the above descriptions, in the present technology, by performing a test through grouping a plurality of word lines, it is possible to shorten a time for which a test operation for detecting a weak cell is performed.

Although various embodiments have been described for illustrative purposes, it will be apparent to those skilled in the art that various changes and modifications may be made without departing from the spirit and scope of the invention as defined in the following claims.

What is claimed is:
1. A memory device comprising:
a plurality of word lines;
a plurality of bit lines;
a plurality of memory cells, each memory cell coupled to a corresponding word line among the plurality of word lines and a corresponding bit line among the plurality of bit lines; and
a control block suitable for controlling at least two word lines among the plurality of word lines to be activated together, and determining whether or not a weak cell exists, based on a voltage of a bit line corresponding to the activated word lines,
wherein the control block determines that the weak cell exists among memory cells coupled to the activated word lines, when the voltage of the bit line corresponding to the activated word lines is lower than a reference voltage, and determines that the weak cell does not exist among the memory cells coupled to the activated word lines, when the voltage of the bit line corresponding to the activated word lines is equal to or higher than the reference voltage.

2. The memory device according to claim 1, wherein the weak cell includes a memory cell of which data retention time is shorter than a reference time, among the plurality of memory cells.

3. The memory device according to claim 1, wherein the control block stores an address corresponding in common to the activated word lines, as a weak address, when it is determined that the weak cell exists among the memory cells coupled to the activated word lines.

4. The memory device according to claim 1, further comprising:
a plurality of global lines suitable for transferring data corresponding to voltages of the plurality of bit lines;
a pipe latch block suitable for latching, aligning and outputting data of the plurality of global lines; and
a plurality of data output lines suitable for transferring data outputted from the pipe latch block.

5. The memory device according to claim 4, wherein the control block compares the data of the plurality of global lines and test data,
determines that the weak cell exists among the memory cells coupled to the activated word lines, when the data of the plurality of global lines and the test data are different, and
determines that the weak cell does not exist among the memory cells coupled to the activated word lines, when the data of the plurality of global lines and the test data are the same.

6. The memory device according to claim 4, wherein the control block compares the data of the pipe latch block and test data,
determines that the weak cell exists among the memory cells coupled to the activated word lines, when the data of the pipe latch block and the test data are different, and
determines that the weak cell does not exist among the memory cells coupled to the activated word lines, when the data of the pipe latch block and the test data are the same.

7. The memory device according to claim 4, wherein the control block compares data of the plurality of data output lines and test data,
determines that the weak cell exists among the memory cells coupled to the activated word lines, when the data of the plurality of data output lines and the test data are different, and
determines that the weak cell does not exist among the memory cells coupled to the activated word lines, when the data of the plurality of data output lines and the test data are the same.

8. The memory device according to claim 1, wherein the activated word lines are the same in a predetermined number of upper bits among a plurality of bits included in addresses corresponding thereto.

9. The memory device according to claim 1, wherein memory cells coupled to the same bit line among memory cells coupled to the activated word lines and the bit line, share charges.

10. The memory device according to claim 1, further comprising:
a plurality of sense amplifiers suitable for sensing and amplifying data of corresponding bit lines among the plurality of bit lines,
wherein, when a test operation is performed by the control block, the plurality of sense amplifiers are deactivated and do not perform an operation of sensing and amplifying the data of the corresponding bit lines.

11. A method for operating a memory device including a plurality of word lines, a plurality of bit lines and a plurality of memory cells, each memory cell coupled to a corresponding word line among the plurality of word lines and a corresponding bit line among the plurality of bit lines, the method comprising:
activating at least two word lines together among the plurality of word lines;
sharing charges between memory cells coupled to the same bit line among memory cells coupled to the activated word lines and the bit line; and
determining that a weak cell exists among the memory cells coupled to the activated word lines, based on a voltage of the bit line corresponding to the activated word lines being lower than a reference voltage, and determining that the weak cell does not exist among the memory cells coupled to the activated word lines, when the voltage of the bit line corresponding to the activated word lines is equal to or higher than the reference voltage.

12. The method according to claim 11, wherein the weak cell includes a memory cell of which data retention time is shorter than a reference time, among the plurality of memory cells.

13. The method according to claim 11, further comprising:
storing an address corresponding in common to the activated word lines, as a weak address, when it is determined that the weak cell exists among the memory cells coupled to the activated word lines.

14. The method according to claim 11, wherein the activating of the at least two word lines comprises:
applying a test address which is the same as a predetermined number of upper bits among a plurality of bits included in each of addresses of the at least two word lines; and
selecting and driving the at least two word lines together in response to the test address.

15. The method according to claim 11, further comprising:
transferring data corresponding to the voltage of the bit line corresponding to the activated word lines;
comparing the transferred data and test data;
determining that the weak cell exists among the memory cells coupled to the activated word lines, when the transferred data and the test data are different; and
determining that the weak cell does not exist among the memory cells coupled to the activated word lines, when the transferred data and the test data are the same.

16. The method according to claim 11, further comprising:
detecting a word line in which the weak cell exists among memory cells coupled to the word line, by testing each of word lines included in the at least two word lines, when the weak cell exists among the memory cells coupled to the at least two word lines.

17. A memory device comprising:
first to $n^{th}$ (where n is a natural number) word line groups each including at least two word lines; and
a control block suitable for controlling the first to $n^{th}$ word line groups to be activated sequentially, and determining whether or not a weak cell exists among memory cells coupled to an activated word line group, based on a voltage of a bit line corresponding to the activated word line group,
wherein the control block determines that the weak cell exists among the memory cells coupled to the activated word line group, when the voltage of the bit line corresponding to the activated word line group is lower than a reference voltage, and determines that the weak cell does not exist among the memory cells coupled to the activated word line group, when the voltage of the bit line corresponding to the activated word line group is equal to or higher than the reference voltage.

18. The memory device according to claim 17, wherein the control block compares data corresponding to the voltage of the bit line corresponding to the activated word line group and test data, determines that the weak cell exists among the memory cells coupled to the activated word line group, when the data and test data are different, and determines that the weak cell does not exist among the memory cells coupled to the activated word line group, when the data and test data are the same.

* * * * *